United States Patent
Ho et al.

(10) Patent No.: US 8,508,022 B2
(45) Date of Patent: Aug. 13, 2013

(54) ULTRA THIN PACKAGE FOR ELECTRIC ACOUSTIC SENSOR CHIP OF MICRO ELECTRO MECHANICAL SYSTEM

(75) Inventors: Tzong-Che Ho, Hsinchu (TW); Jason Pan, Hsinchu County (TW); Pin Chang, Hsinchu (TW); Chin-Horng Wang, Hsinchu (TW); Jung-Tai Chen, Hsinchu County (TW); Hsin-Li Lee, Hsinchu County (TW); Kai-Hsiang Yen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 825 days.

(21) Appl. No.: 12/172,900

(22) Filed: Jul. 14, 2008

(65) Prior Publication Data
US 2009/0161901 A1 Jun. 25, 2009

(30) Foreign Application Priority Data
Dec. 24, 2007 (TW) .............................. 96149697 A

(51) Int. Cl.
*H01L 23/552* (2006.01)
*H01L 21/00* (2006.01)
*H05K 7/00* (2006.01)

(52) U.S. Cl.
USPC ........... 257/659; 257/684; 257/738; 257/780; 257/E23.021; 257/E23.023; 361/760; 438/51

(58) Field of Classification Search
None
See application file for complete search history.

(56) References Cited

U.S. PATENT DOCUMENTS

| | | | |
|---|---|---|---|
| 6,522,762 B1 | 2/2003 | Mullenborn et al. | |
| 7,291,547 B2 * | 11/2007 | Timme et al. .................. | 438/612 |
| 2004/0018348 A1 * | 1/2004 | Saito .............................. | 428/209 |
| 2004/0209387 A1 * | 10/2004 | Hong ............................... | 438/27 |
| 2005/0189622 A1 * | 9/2005 | Humpston et al. ............ | 257/659 |
| 2005/0189635 A1 * | 9/2005 | Humpston et al. ............ | 257/678 |
| 2006/0108686 A1 * | 5/2006 | Okada ........................... | 257/738 |
| 2006/0151847 A1 * | 7/2006 | Kwon et al. ................... | 257/433 |

FOREIGN PATENT DOCUMENTS

| | | | |
|---|---|---|---|
| JP | 2001083004 A | * | 3/2001 |
| JP | 2005203944 | | 7/2005 |
| JP | 2007-43327 | | 2/2007 |
| JP | 2007286671 | | 2/2007 |

OTHER PUBLICATIONS

Japan Patent Office, Office Action, Patent Application Serial No. 2008-312220, Sep. 27, 2011, Japan.

* cited by examiner

*Primary Examiner* — Alonzo Chambliss

(57) ABSTRACT

An ultra thin package for an electric acoustic sensor chip of a micro electro mechanical system is provided. A substrate has a first substrate surface and a second substrate surface opposite to the first substrate surface. At least one conductor bump is formed on the second substrate surface. An electric acoustic sensor chip having a first chip surface and a second chip surface opposite to the first chip surface is provided. The first chip surface is electrically connected to the conductor bump. The conductor bump is positioned between the second substrate surface and the first chip surface to create a space. The conductor bump is used for transferring a signal from the sensor chip to the substrate. An acoustic opening passing through the substrate is formed.

18 Claims, 3 Drawing Sheets

US 8,508,022 B2

ULTRA THIN PACKAGE FOR ELECTRIC ACOUSTIC SENSOR CHIP OF MICRO ELECTRO MECHANICAL SYSTEM

CROSS REFERENCE TO RELATED APPLICATIONS

This Application claims priority of Taiwan Patent Application No. 096149697, filed on Dec. 24, 2007, the entirety of which is incorporated by reference herein.

BACKGROUND OF THE INVENTION

1. Field of the Invention

The invention relates to a package of a micro electro mechanical system, and more particularly to an ultra thin package for an electric acoustic sensor chip of a micro electro mechanical system.

2. Description of the Related Art

Packaging techniques for electronic devices have advanced along with the advancement in scaling trends, in increasing electronic product functions, and in increasing the number of electronic devices in electronic products. Thus, with miniaturization of integrated devices, influence of packaging techniques in relation to costs, size, and operating efficiency for electronic devices or products has increased. Currently, miniaturized and multifunctional integrated devices are being fabricated by the micro electro mechanical system (MEMS) technique. The MEMS technique is a method for fabricating an integrated device at the wafer level. The aim of the MEMS is to integrate the electrical system and the mechanical system into a wafer. The fabrication and the packaging process of the mechanical system is much more complicated than that of the electrical system. Additionally, the MEMS technique is used for fabricating and packaging electronic devices such as cellular phone microphones, Thus, due to the limitations of the conventional MEMS packaging process, there exists quality and stability deficiencies when manufacturing cellular phone microphones.

Specifically, due to a thicker substrate and selected materials of the conventional MEMS package, packaging of a cellular phone microphone can not be accomplished by automation. Thus, hindering miniaturization and cost reduction.

Additionally, efficiency of the cellular phone microphone is hindered due to the larger sized electronic devices effecting length of time for signal transfer and electro magnetic interference caused by increased integration.

Thus, an ultra thin package of a micro electro mechanical system fabricated with lower cost and used for preventing electro magnetic interference is desirable.

BRIEF SUMMARY OF INVENTION

A detailed description is given in the following embodiments with reference to the accompanying drawings.

The invention provides an ultra thin package for an electric acoustic sensor chip of a micro electro mechanical system. An embodiment of the ultra thin package for the electric acoustic sensor chip of the micro electro mechanical system comprises: a substrate comprising a first substrate surface and a second substrate surface opposite to the first substrate surface; at least one conductor bump formed on the second substrate surface; an electric acoustic sensor chip having a first chip surface and a second chip surface opposite to the first chip surface, and the first chip surface electrically connected to the conductor bump, wherein the conductor bump is positioned between the second substrate surface and the first chip surface to create a space, and wherein the conductor bump is used for transferring a signal from the electric acoustic sensor chip to the substrate; an acoustic opening passing through the substrate; and a chamber positioned between the second substrate surface and the first chip surface and communicating with the acoustic opening, wherein the chamber is formed by sealing the outer surroundings of the space with a filling layer.

Another embodiment of the ultra thin package for the electric acoustic sensor chip of the micro electro mechanical system comprises a substrate comprising: a first substrate surface and a second substrate surface opposite to the first substrate surface; at least one conductor bump formed on the second substrate surface; an electric acoustic sensor chip having a first chip surface and a second chip surface opposite to the first chip surface, and the first chip surface electrically connected to the conductor bump, wherein the conductor bump is positioned between the second substrate surface and the first chip surface to create a space, and wherein the conductor bump is used for transferring a signal from the electric acoustic sensor chip to the substrate; an acoustic opening passing through the substrate; a chamber positioned between the second substrate surface and the first chip surface and communicating with the acoustic opening, wherein the chamber is formed by sealing the outer surroundings of the space with a filling layer; and at least one conductor ball formed on the second substrate surface outside of the electric acoustic sensor chip, and electrically connected to a system point for transferring the signal from the substrate to the system point.

Yet another embodiment of the ultra thin package for the electric acoustic sensor chip of the micro electro mechanical system comprises: a substrate comprising a first substrate surface and a second substrate surface opposite to the first substrate surface; at least one conductor bump formed on the second substrate surface; an electric acoustic sensor chip having a first chip surface and a second chip surface opposite to the first chip surface, and the first chip surface electrically connected to the conductor bump, wherein the conductor bump is positioned between the second substrate surface and the first chip surface to create a space, and wherein the conductor bump is used for transferring a signal from the electric acoustic sensor chip to the substrate; an acoustic opening passing through the substrate; a chamber positioned between the second substrate surface and the first chip surface and communicating with the acoustic opening, wherein the chamber is formed by sealing the outer surroundings of the space with a filling layer; and a conductor plug passing through the extended layer outside of the electric acoustic sensor chip, and electrically connected to the second substrate surface for transferring the signal from the substrate to the system point, wherein the substrate and the system point are connected by the conductor plug.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
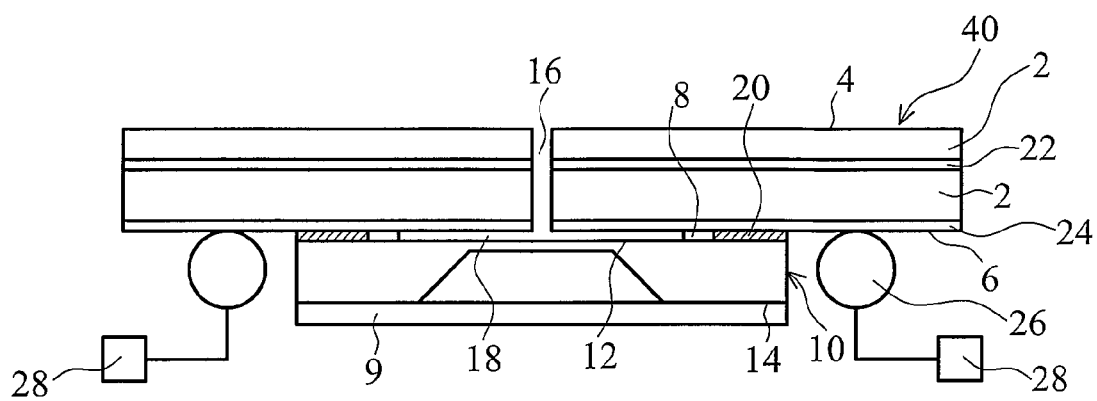
FIG. 1 to FIG. 4 show cross-section views of embodiments of a micro electro mechanical system.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide an ultra thin package for an electric acoustic sensor chip of a micro electro mechanical system. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIG. 1 illustrates a cross-section view of an embodiment of the micro electro mechanical system. In one embodiment, the micro electro mechanical system comprises a substrate 40 comprising a first substrate surface 4 and a second substrate surface 6. The micro electro mechanical system may comprise an electric acoustic sensor chip 10 having a first chip surface 12 and a second chip surface 14. A back acoustic chamber plate 9 may be formed on the second chip surface 14. A conductor bump 8 may be formed between the second substrate surface 6 of the substrate 40 and the first chip surface 12 of the electric acoustic sensor chip 10. The substrate 40, thus, may be electrically connected to the electric acoustic sensor chip 10. In one embodiment, the electric acoustic sensor chip 10 and the substrate 40 may be connected by a flip chip technique or a wire bond technique. The electric acoustic sensor chip 10 may be formed by integrating circuit functions, such as a switching function or a microelectronic function, with software, or integrating integrated circuits into a single chip by a CMOS process and a microelectronic technique. The electric acoustic sensor chip 10 may sense and respond to sounds from the surroundings environment. In one embodiment, a polymer sensor film may be formed over the first chip surface 12 of the electric acoustic sensor chip 10.

Referring to FIG. 1, the substrate 40 may be a multi-layered structure including substrate materials 2, a metal layer 24 and at least one shielding layer 22. The substrate material 2 may be a rigid substrate material or flexible substrate material. In the preferred embodiment, the rigid substrate material may be a copper coil substrate. The copper coil substrate may be formed by immersing reinforcing materials in resin viscose. The reinforcing materials may be dried, cut into a shape and, stacked into a blank determination and foiled by a copper in sequence. Next, the reinforcing materials may be molded by a steel mold in a high temperature and pressure environment of a press machine. The flexible substrate material is usually a semi finished product of the copper-clad laminate (usually formed by immersing glass fiber in resin viscose and drying it). The copper coil substrate may be classified in a variety of ways. The copper-clad laminate may be classified as a paper laminate, a glass fiber laminate, a composite laminate (such as series of CEM), a multi-layered laminate and a special material laminate (such as ceramic material, metal core and etc.) according to the types of the reinforcing materials. The paper laminate may be classified as a phenol formaldehyde resin (such as XPC, XXXPC, FR-1, FR-2 and etc.), an epoxy resin (such as FE-3), a polyester resin and etc. according to the types of the adopted resin viscose. The type of the glass fiber laminate often used may be an epoxy resin (such as FE-4 or FE-5). Other special resins (reinforced with the reinforcing materials such as glass fiber, polyamide, and non-woven fiber) include bismaleimide triazine resin (BT), polyimide (PI), Polyphenylene Oxide (PPO), Styrene Maleic anhydride copolymer, polycyanurate, polyolefin or etc. The type of the glass fiber laminate may be classified as a flame-retarded type (such as UL94-VO or UL94-V1) and a non-flame-retarded type (such as UL94-HB). Due to environmental consciousness, a novel type of glass fiber not including any bromine element of a flame-retarded glass fiber laminate, also called a green type flame-retarded glass fiber laminate, has also been used. With continued development of new electronic techniques, demand for varied glass fiber laminate functions has increased. The glass fiber laminate may be classified as a general, a low-k, a high heat-resistant, a thermal expansion coefficient glass fiber laminate or other types.

Referring to FIG. 1, the substrate 40 may include the metal layer 24 serving as an interconnect structure. The substrate 40 may include at least one shielding layer 22 extending through the substrate 40 and used for preventing electro magnetic interference. The shielding layer 22 may comprise conductive polymer, such as silver epoxy, or metal, such as copper or gold.

In some embodiments, the substrate 40 may be a multi-layered structure. The substrate material 22 may be silicon. The substrate material 22 may also be a flexible substrate material that can be twisted, thus expanding application usages and process techniques. The multi-layered substrate 40 may have a thickness thinner than that of the thickness of the conventional silicon substrate, thus resulting in a thinner package thickness. The shielding layer 22, used for preventing electro magnetic interference, may improve the efficiency of a microphone. Thus, a simpler process with lower cost is provided since the metal layer 24 may be formed and used to function as an electrical connection, without etching the substrate to form connectors during the packaging process.

The conductor bump 8 may include Sn, SnZn alloy, SnAg alloy, SnAu alloy, SnBi alloy, SnAgCu alloy, SnPb alloy or other materials. The substrate 40 may be electrically connected to the electric acoustic sensor chip 10 by the conductor bump 8. The conductor bump 8 may be used for transferring a signal from the electric acoustic sensor chip 10 to the substrate 40.

Referring to FIG. 1, a chamber 18 is provided. The conductor bump 8, positioned between the second substrate surface 6 of the substrate 40 and the first chip surface 12 of the electric acoustic sensor chip 10, may have a height, and thus can create a space between the second substrate surface 6 of the substrate 40 and the first chip surface 12 of the electric acoustic sensor chip 10. The chamber 18 may be formed by sealing the outer surroundings of the space with a filling layer 20. An acoustic opening 16, passing through the substrate and communicating with the chamber 18, may be formed. The acoustic opening 16 may be used to receive external sound waves. The acoustic opening 16 is capable of preventing dust or moisture from entering the chamber 18 for the efficiency and quality of the microphone. In one experimental embodiment, the shielding layer 22 may be formed on the first substrate surface 4 (not shown), and the shielding layer 22 may have at least one hole over the acoustic opening 16. The shielding layer 22, of the embodiment, can be used for preventing electro magnetic interference and is capable of preventing dust or moisture from entering the chamber 18 for the efficiency and quality of the microphone.

A conductor ball 26 may be formed on the second substrate surface 6 outside of the electric acoustic sensor chip 10. The conductor ball 26 may be electrically connected to a system point 28 for transferring the signal from the substrate 40 to the system point 28. In the preferred embodiment, after the signal is transferred from the electric acoustic sensor chip 10, as shown in FIG. 1, to the substrate 40 by the conductor bump 8 on the second substrate surface 6 and metal layer 24 in the substrate 40, the signal may be then transferred from the substrate 40 to the system point 28 by the metal layer 24 and the conductor ball 26 on the second substrate surface 6. A signal may thus not be transferred by the conventional conductive metals formed through the silicon substrate. Therefore, a transfer path shorter than a transfer path of the conventional technique may prevent issues such as decreased signal intensity or signal interference. In other embodiments, the thin flexible laminate may be connected to the second substrate surface 6 outside of the electric acoustic sensor chip 10 by a tape carrier package or chip on film technique, and led from the side by a golden finger, not shown in figures.

Figure 2:
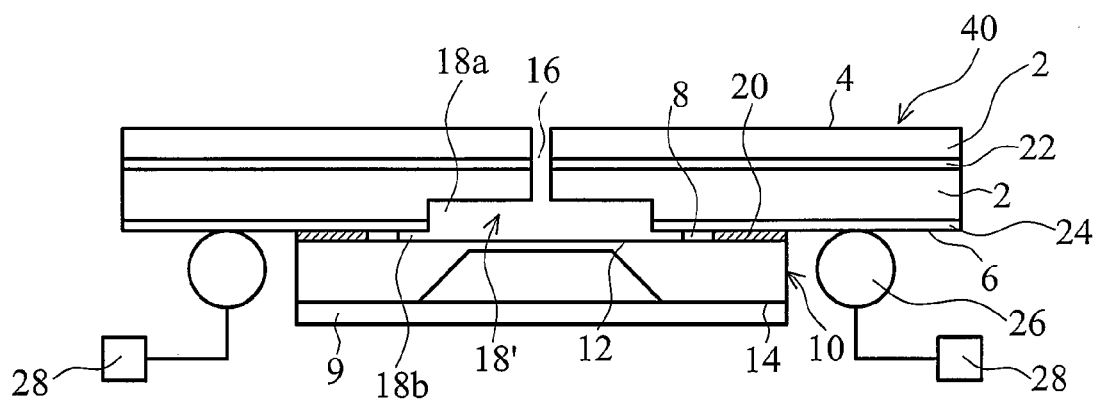

FIG. 2 illustrates a cross-section view of another embodiment of the micro electro mechanical system. The like parts referred to FIG. 1 will not be described in detail. In an exemplary embodiment, the chamber 18' may include the space 18b formed by sealing the outer surroundings of the space 18b between the second substrate surface 6 and the first chip surface 12 with the filling layer 20, and a cavity 18a under the second substrate surface 6. The cavity 18a may be positioned between the acoustic opening 16 and the space 18b. In one embodiment, the shielding layer 22 may be formed on the first substrate surface 4 (not shown), and the shielding layer 22 may have at least one hole over the acoustic opening 16. The shielding layer 22, of the embodiment, can be used for preventing electro magnetic interference and is capable of preventing dust or moisture from entering the chamber 18' for the efficiency and quality of the microphone.

In some embodiments, the cavity 18a, passing through the entire substrate 40 (not shown) may be formed. Thus, in these cases, the formed chamber 18' may pass through the entire substrate 40 (not shown). A fiber layer having tiny holes may be positioned over the chamber 18' at a level which is the same as the first substrate surface 4. The fiber layer having tiny holes and positioned over the chamber 18' can be used for receiving external sound waves and is capable of preventing dust or moisture from entering the chamber 18' for the efficiency and quality of the microphone. In one embodiment, the shielding layer 22 may be formed on the first substrate surface 4 (not shown), and may have at least one hole over the chamber 18'. The shielding layer 22, in this case, can be used for preventing electro magnetic interference and is capable of preventing dust or moisture from entering the chamber 18' for the efficiency and quality of the microphone.

Figure 3:
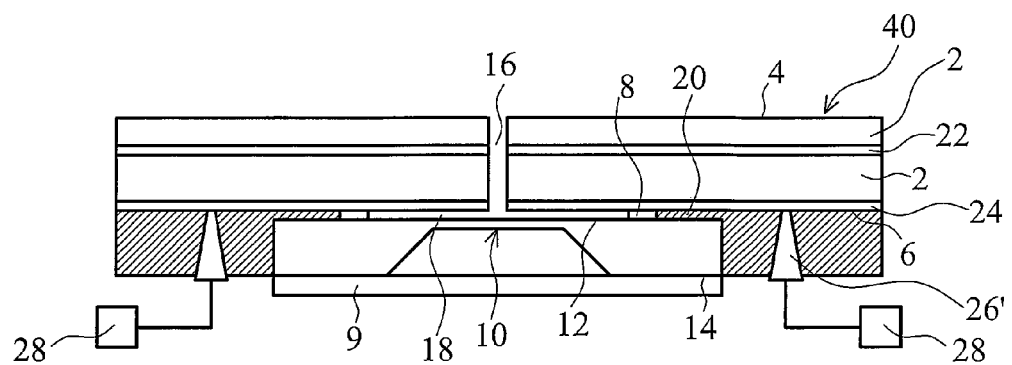

FIG. 3 illustrates a cross-section view of one embodiment of the micro electro mechanical system. The like parts referred to FIG. 1 will not be described in detail. In an exemplary embodiment, the filling layer 20 may comprise an extended layer 20a extending outward to fill a region on the second substrate surface 6 adjacent to the electric acoustic sensor chip 10. A conductor plug 26', passing through the extended layer 20a outside of the electric acoustic sensor chip 10 and electrically connected to the second substrate surface 6 for transferring the signal from the substrate 40 to the system point 28, may be formed. In this case, after the signal is transferred from the electric acoustic sensor chip 10, as shown in FIG. 3 to the substrate 40 by the conductor bump 8 on the second substrate surface 6 and metal layer 24 in the substrate 40, the signal may be transferred from the substrate 40 to the system point 28 by the metal layer 24 and the conductor plug 26' on the second substrate surface 6. The signal may thus not be transferred by the conventional conductive metals formed through the silicon substrate. Therefore, the transfer path is shorter than the transfer path of the conventional technique and may prevent issues such as decreased signal intensity or signal interference.

Figure 4:
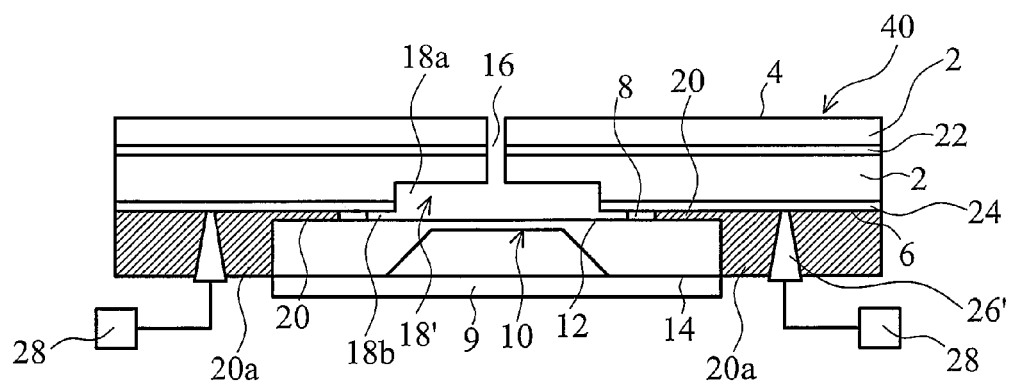

FIG. 4 illustrates a cross-section view of one embodiment of the micro electro mechanical system. The like parts referred to FIG. 3 will not be described in detail. In an exemplary embodiment, the chamber 18' may include the space 18b formed by sealing the outer surroundings of the space 18b between the second substrate surface 6 and the first chip surface 12 with the filling layer 20, and the cavity 18a under the second substrate surface 6. The cavity 18a may be positioned between the acoustic opening 16 and the space 18b. In some embodiments, the cavity 18a, passing through the entire substrate 40 (not shown) may be formed. Thus, in these cases, the formed chamber 18' may pass through the entire substrate 40 (not shown). The fiber layer having tiny holes may be positioned over the chamber 18' at a level same as the first substrate surface 4. The fiber layer having tiny holes and positioned over the chamber 18' can be used for receiving external sound waves and is capable of preventing dust or moisture from entering the chamber 18' for the efficiency and quality of the microphone.

Figure 5:
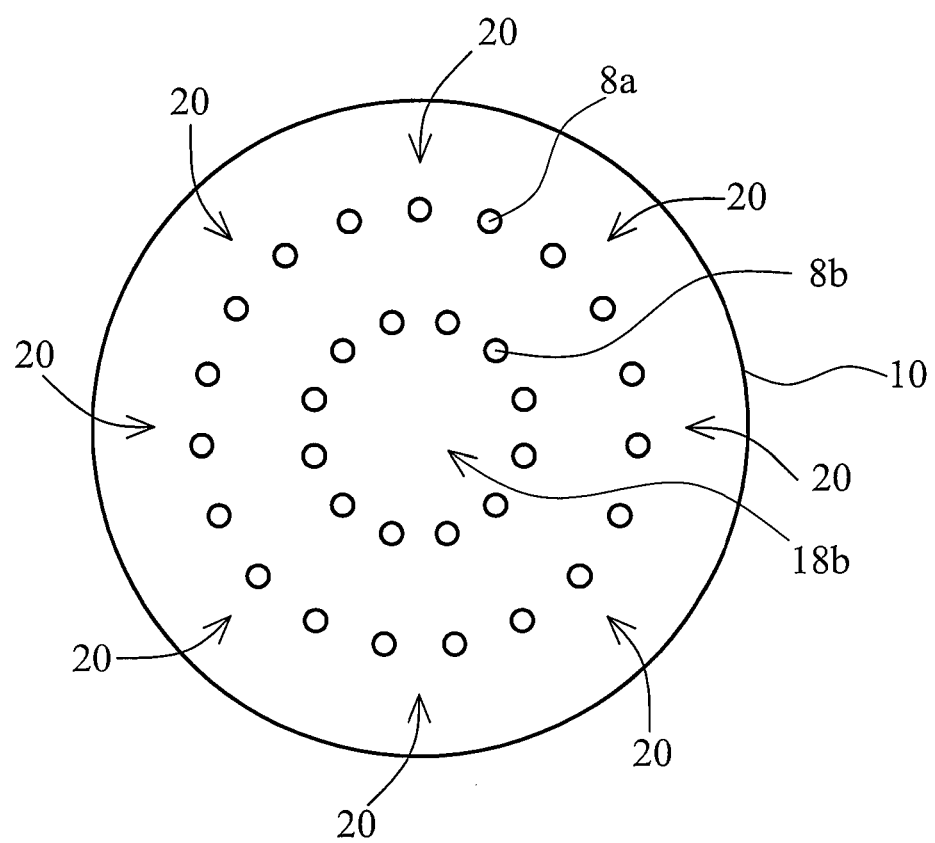
FIG. 5 shows a top view of a method for insulating one embodiment of a method for forming a chamber.

FIG. 5 shows a top view of a method for insulating one embodiment of a micro electro mechanical system by forming the space 18b of the chamber 18 by sealing the outer surroundings of the space 18b between the second substrate surface 6 and the first chip surface 12 with the filling layer 20. A plurality of conductor bumps may be formed on the surface of the electric acoustic sensor chip 10. The conductor bumps may be arranged into a smaller ring arrangement of the conductor bumps 8a and a bigger ring arrangement of the conductor bumps 8a. The ring arrangement described may comprise a circle, a triangle, a square or other rounded arrangements. With the conductor bumps 8a of the smaller ring arrangement serving as a stop layer, the chamber 18 or 18' may be formed between the second substrate surface 6 and the first chip surface 12 by sealing the outer surroundings of the space 18b without sealing the entire space 18b with the filling layer 20, by moving from the conductor bump 8b of the bigger ring arrangement inward into the outer surroundings of the space 18b by the capillarity effect.

Some advantages of the micro electro mechanical system are described in the following. The substrate may be a multi-layered structure comprising the substrate materials, the metal layer and at least one shielding layer. The substrate material may be a flexible substrate material that can be twisted, thus expanding application usages and process techniques. The multi-layered substrate may have a thickness thinner than that of the thickness of the conventional silicon substrate, and thus result in a thinner package thickness. The shielding layer, used for preventing electro magnetic interference, may improve the efficiency of the microphone. A simpler process with lower cost is provided since the metal layer may be formed and used to function as an electrical connection, without etching the substrate to form connectors during the packaging process. The opening or the tiny holes of the fiber layer positioned over the chamber can be used for receiving external sound waves and is capable of preventing dust or moisture from entering the chamber for the efficiency and quality of the microphone. After the signal is transferred from the electric acoustic sensor chip to the substrate by the conductor bump on the second substrate surface and metal layer in the substrate, the signal may be transferred from the substrate to the system point by the metal layer and the conductor ball on the second substrate surface. A signal may thus not be transferred by the conventional conductive metals formed through the silicon substrate. Therefore, a transfer path shorter than a transfer path of the conventional technique may prevent issues such as decreased signal intensity or signal interference.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ultra thin package for an electric acoustic sensor chip of a micro electro mechanical system, comprising:
    a substrate comprising a first substrate surface and a second substrate surface opposite to the first substrate surface;
    a shielding layer embedded within the substrate between the first substrate surface and second substrate surface for preventing electro magnetic interference;
    at least one conductor bump formed on the second substrate surface;
    an electric acoustic sensor chip having a first chip surface, a second chip surface opposite to the first chip surface, and a side surface, wherein the first chip surface is electrically connected to the conductor bump, the conductor bump is positioned between the second substrate surface and the first chip surface to create a space, and the conductor bump is used for transferring a signal from the electric acoustic sensor chip to the substrate;
    a back acoustic chamber plate disposed on and contacting the second chip surface, wherein a side of the back acoustic chamber plate does not extend beyond the side surface of the electric acoustic sensor chip;
    an acoustic opening passing through the substrate; and
    a chamber positioned between the second substrate surface and the first chip surface and communicating with the acoustic opening, wherein the chamber is formed by sealing the outer surroundings of the space with a filling layer, wherein the filling layer comprises an extended layer extending outward to fill a region on the second substrate surface adjacent to the electric acoustic sensor chip.

2. The ultra thin package for the electric acoustic sensor chip of the micro electro mechanical system as claimed in claim 1, wherein the substrate is a multi-layered structure.

3. The ultra thin package for the electric acoustic sensor chip of the micro electro mechanical system as claimed in claim 2, wherein the substrate comprises a substrate material, wherein the substrate material comprises a rigid substrate material comprising ceramic, metal core or copper-clad laminate.

4. The ultra thin package for the electric acoustic sensor chip of the micro electro mechanical system as claimed in claim 2, wherein the substrate material comprises a flexible substrate material comprising paper laminate or glass fiber laminate.

5. The ultra thin package for the electric acoustic sensor chip of the micro electro mechanical system as claimed in claim 4, wherein the paper laminate comprises phenol formaldehyde resin, epoxy resin or polyester resin.

6. The ultra thin package for the electric acoustic sensor chip of the micro electro mechanical system as claimed in claim 4, wherein the glass fiber laminate comprises epoxy resin.

7. The ultra thin package for the electric acoustic sensor chip of the micro electro mechanical system as claimed in claim 1, wherein the chamber comprises a cavity under the second substrate surface, wherein the cavity is positioned between the acoustic opening and the space.

8. The ultra thin package for the electric acoustic sensor chip of the micro electro mechanical system as claimed in claim 1, further comprising a conductor plug passing through the extended layer outside of the electric acoustic sensor chip, and electrically connected to the second substrate surface for transferring the signal from the substrate to the system point, wherein the substrate and the system point are connected by the conductor plug.

9. The ultra thin package for the electric acoustic sensor chip of the micro electro mechanical system as claimed in claim 1, wherein the second chip surface includes a recess, and the back acoustic chamber plate extends across the recess.

10. An ultra thin package for an electric acoustic sensor chip of a micro electro mechanical system, comprising:
    a substrate comprising a first substrate surface and a second substrate surface opposite to the first substrate surface;
    a shielding layer embedded within the substrate between the first substrate surface and second substrate surface for preventing electro magnetic interference;
    at least one conductor bump formed on the second substrate surface;
    an electric acoustic sensor chip having a first chip surface, a second chip surface opposite to the first chip surface, and a side surface, wherein the first chip surface is electrically connected to the conductor bump, wherein the conductor bump is positioned between the second substrate surface and the first chip surface to create a space, and wherein the conductor bump is used for transferring a signal from the electric acoustic sensor chip to the substrate;
    a back acoustic chamber plate disposed on and contacting the second chip surface, wherein a side of the back acoustic chamber plate does not extend beyond the side surface of the electric acoustic sensor chip;
    an acoustic opening passing through the substrate;
    a chamber positioned between the second substrate surface and the first chip surface and communicating with the acoustic opening, wherein the chamber is formed by sealing the outer surroundings of the space with a filling layer; and
    at least one conductor ball formed on the second substrate surface outside of the electric acoustic sensor chip, adjacent to both the filling layer and the electric acoustic sensor chip, and electrically connected to a system point for transferring the signal from the substrate to the system point.

11. The ultra thin package for the electric acoustic sensor chip of the micro electro mechanical system as claimed in claim 10, wherein the substrate is a multi-layered structure.

12. The ultra thin package for the electric acoustic sensor chip of the micro electro mechanical system as claimed in claim 11, wherein the substrate comprises a substrate material, wherein the substrate material comprises a rigid substrate material comprising ceramic, metal core or copper-clad laminate.

13. The ultra thin package for the electric acoustic sensor chip of the micro electro mechanical system as claimed in claim 11, wherein the substrate material comprises a flexible substrate material comprising paper laminate or glass fiber laminate.

14. The ultra thin package for the electric acoustic sensor chip of the micro electro mechanical system as claimed in claim 10, wherein the second chip surface includes a recess, and the back acoustic chamber plate extends across the recess.

15. An ultra thin package for an electric acoustic sensor chip of a micro electro mechanical system, comprising:
- a substrate comprising a first substrate surface and a second substrate surface opposite to the first substrate surface;
- a shielding layer embedded within the substrate between the first substrate surface and second substrate surface for preventing electro magnetic interference;
- at least one conductor bump formed on the second substrate surface;
- an electric acoustic sensor chip having a first chip surface and a second chip surface opposite to the first chip surface, wherein the first chip surface is electrically connected to the conductor bump, wherein the conductor bump is positioned between the second substrate surface and the first chip surface to create a space, and wherein the conductor bump is used for transferring a signal from the electric acoustic sensor chip to the substrate;
- an acoustic opening passing through the substrate;
- a chamber positioned between the second substrate surface and the first chip surface and communicating with the acoustic opening, wherein the chamber is formed by sealing the outer surroundings of the space with a filling layer, wherein the filling layer comprises an extended layer extending outward to fill a region on the second substrate surface adjacent to the electric acoustic sensor chip; and
- a conductor plug passing through the extended layer outside of the electric acoustic sensor chip, and electrically connected to the second substrate surface for transferring the signal from the substrate to the system point, wherein the substrate and the system point are connected by the conductor plug.

16. The ultra thin package for the electric acoustic sensor chip of the micro electro mechanical system as claimed in claim 15, wherein the substrate is a multi-layered structure.

17. The ultra thin package for the electric acoustic sensor chip of the micro electro mechanical system as claimed in claim 16, further comprising a shielding layer embedded within the substrate between the first substrate surface and second substrate surface for preventing electro magnetic interference.

18. The ultra thin package for the electric acoustic sensor chip of the micro electro mechanical system as claimed in claim 16, wherein the substrate comprises a substrate material, wherein the substrate material comprises a rigid substrate material comprising ceramic, metal core or copper-clad laminate, or a flexible substrate material comprising paper laminate or glass fiber laminate.

* * * * *